(12) United States Patent
Simon

(10) Patent No.: US 11,329,207 B2
(45) Date of Patent: May 10, 2022

(54) EMISSIVE DISPLAY DEVICE COMPRISING LEDS

(71) Applicant: Commissariat à l'Énergie Atomique et aux Énergies Alternatives, Paris (FR)

(72) Inventor: Julia Simon, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 20 days.

(21) Appl. No.: 17/073,243

(22) Filed: Oct. 16, 2020

(65) Prior Publication Data

US 2021/0118946 A1    Apr. 22, 2021

(30) Foreign Application Priority Data

Oct. 22, 2019 (FR) ...................................... 1911815

(51) Int. Cl.
*H01L 33/62* (2010.01)
*H01L 27/15* (2006.01)
*H01L 33/00* (2010.01)
*H01L 33/60* (2010.01)
(Continued)

(52) U.S. Cl.
CPC ............... *H01L 33/62* (2013.01); *G09G 3/32* (2013.01); *H01L 27/156* (2013.01); *H01L 29/66121* (2013.01); *H01L 33/005* (2013.01); *H01L 33/60* (2013.01); *H01L 2933/0066* (2013.01)

(58) Field of Classification Search
CPC ... G09G 3/32; H01L 29/66121; H01L 27/156; H01L 33/005; H01L 33/62; H01L 2933/0066
See application file for complete search history.

(56) References Cited

U.S. PATENT DOCUMENTS

| 7,623,560 B2 | 11/2009 | El-Ghoroury et al. |
| 2006/0255343 A1 | 11/2006 | Ogihara et al. |

(Continued)

FOREIGN PATENT DOCUMENTS

| WO | WO 2018/002485 A1 | 1/2018 |
| WO | WO 2019/103568 A1 | 5/2019 |

OTHER PUBLICATIONS

FR1911815, Jun. 22, 2020, Preliminary Search Report.
Preliminary Search Report for French Application No. 1911815, dated Jun. 22, 2020.

*Primary Examiner* — Feifei Yeung Lopez
(74) *Attorney, Agent, or Firm* — Wolf, Greenfield & Sacks, P.C.

(57) ABSTRACT

An emissive display device including LEDs, including a plurality of pixels, each including: an elementary control cell formed inside and on top of a semiconductor substrate; a first LED capable of emitting in a first wavelength range, arranged on the upper surface of the elementary control cell and having a first conduction region connected to a first connection pad of the elementary control cell; and a second LED capable of emitting in a second wavelength range, having a surface area smaller than that of the first LED, arranged on the upper surface of the first LED opposite a central region of the first LED, and having a first conduction region connected to a second connection pad of the elementary control cell via a first conductive via crossing the first LED.

11 Claims, 9 Drawing Sheets

(51) Int. Cl.
*G09G 3/32* (2016.01)
*H01L 29/66* (2006.01)

(56) References Cited

U.S. PATENT DOCUMENTS

2008/0251799 A1* 10/2008 Ikezawa .............. H01L 25/0756
257/89
2018/0204826 A1 7/2018 Or-Bach et al.

* cited by examiner

EMISSIVE DISPLAY DEVICE COMPRISING LEDS

This application claims the priority benefit of French patent application number FR No. 19/11815, filed on Oct. 22, 2019, the content of which is hereby incorporated by reference in its entirety to the maximum extent allowable by law.

TECHNICAL BACKGROUND

The present disclosure concerns the field of optoelectronic devices. It more particularly concerns the forming of an emissive display device comprising a plurality of light-emitting diodes (LED), for example, made of gallium nitride, and an electronic circuit for controlling the LEDs.

PRIOR ART

The forming of a color display device, that is, a device comprising a plurality of pixels, each comprising a plurality of individually-controllable LEDs, capable of respectively emitting in different wavelength ranges, is more particularly considered.

It would be desirable to at least partly improve certain aspects of known emissive display devices with color LEDs.

SUMMARY

For this purpose, an embodiment provides an emissive display device comprising LEDs, comprising a plurality of pixels, each comprising:
- an elementary control cell formed inside and on top of a semiconductor substrate;
- a first LED capable of emitting in a first wavelength range, arranged on the upper surface of the elementary control cell and having a first conduction region connected to a first connection pad of the elementary control cell; and
- a second LED capable of emitting in a second wavelength range, having a surface area smaller than that of the first LED, arranged on the upper surface of the first LED opposite a central region of the first LED, and having a first conduction region connected to a second connection pad of the elementary control cell via a first conductive via crossing the first LED.

According to an embodiment, each pixel further comprises a third LED capable of emitting in a third wavelength range, having a surface area smaller than that of the second LED, arranged on the upper surface of the second LED opposite a central region of the second LED, and having a first conduction region connected to a third connection pad of the elementary control cell via a second conductive via crossing the first and second LEDs.

According to an embodiment, each pixel comprises a metallic peripheral wall totally surrounding the pixel and extending all along the height of the LEDs of the pixel.

According to an embodiment, the peripheral wall is reflective for the light emitted by each LED and forms a mirror guiding the light emitted by each LED.

According to an embodiment, in each pixel, each LED has a second conduction region connected to the metallic peripheral wall of the pixel.

According to an embodiment, each LED comprises a stack comprising, in the order from the upper surface of the semiconductor substrate, a first doped semiconductor layer of a first conductivity type, forming the first conduction region of the LED, an active layer, and a second doped semiconductor layer of the second conductivity type, forming the second conduction region of the LED.

According to an embodiment, in each pixel, each LED is connected to the metallic peripheral wall of the pixel by a side of its second semiconductor layer.

According to an embodiment, in each pixel, each LED has its first semiconductor layer in contact, by its lower surface, with a metal layer extending under the entire surface of the LED.

According to an embodiment, for each LED, the metal layer in contact with the lower surface of the first semiconductor layer of the LED is a reflective layer forming a mirror guiding the light emitted by each LED.

According to an embodiment, the first and second conduction regions of the LEDs are respectively anode regions and cathode regions.

According to an embodiment, each pixel comprises a transparent dielectric region covering a peripheral portion of the first LED which is not covered by the second LED.

According to an embodiment, the first LED has, in a peripheral portion of the first LED which is not covered by the second LED, nanostructures capable of favoring the extraction of the light emitted by the first LED.

Another embodiment provides a method of manufacturing an emissive display device comprising LEDs such as defined hereabove, comprising the successive steps of:
- placing a first active LED stack on the upper surface of an integrated control circuit comprising the elementary control cells of the device, so that the first active LED stack continuously extends all over the surface of the integrated control circuit;
- forming in the first active LED stack trenches laterally delimiting the first LEDs of the device;
- placing a second active LED stack on the upper surface of the assembly comprising the integrated control circuit and the first LEDs, so that the first active LED stack continuously extends all over the surface of the integrated control circuit; and
- forming in the second active LED stack trenches laterally delimiting the second LEDs of the device.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of an electronic circuit for controlling the described display devices has not been detailed, the forming of such a circuit being within the abilities of those skilled in the art based on the elements of the present description.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1A:
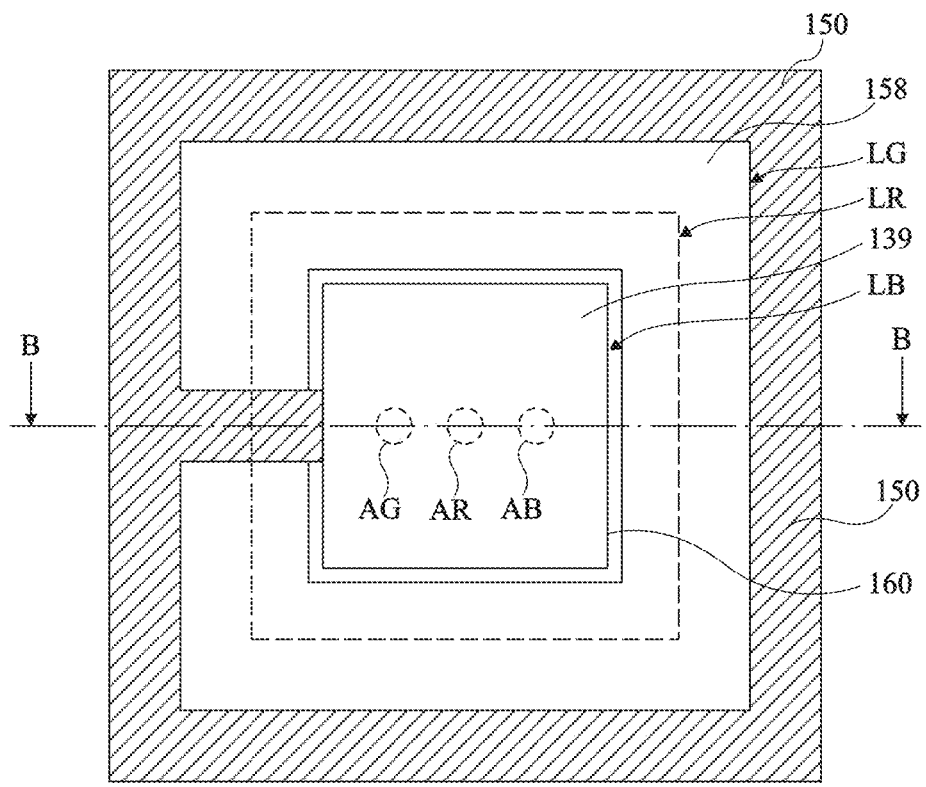
FIG. 1A is a top view of a pixel of an emissive display device comprising LEDs according to an embodiment.
Figure 1B:
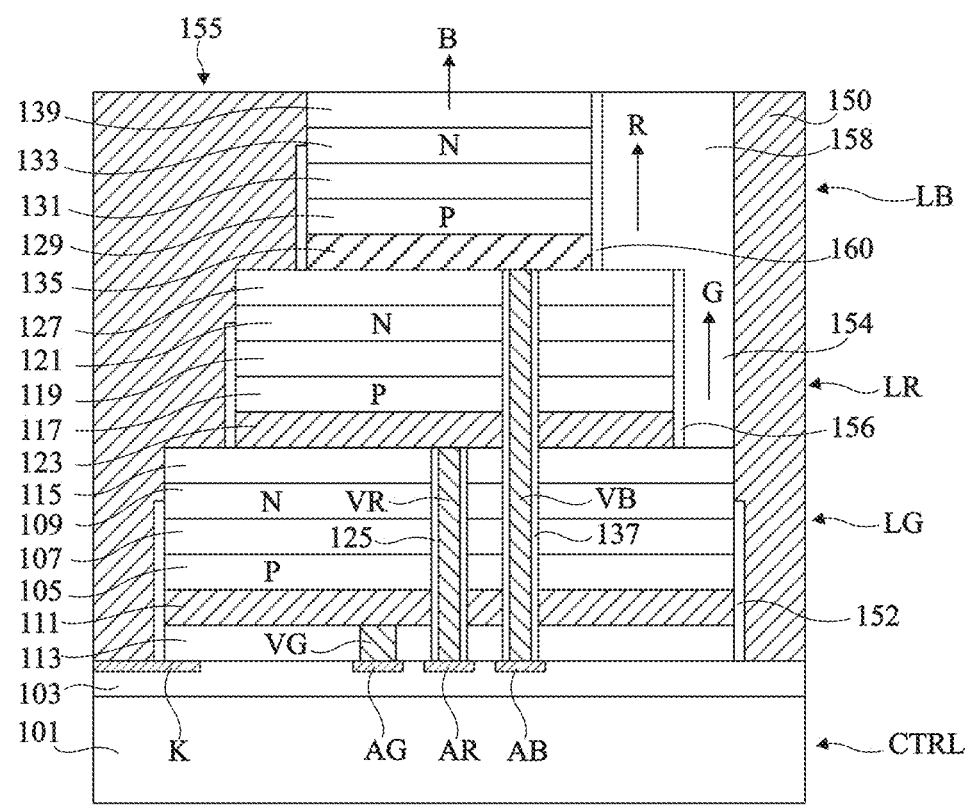
FIG. 1B is a cross-section view of the pixel of FIG. 1A.

FIGS. 1A and 1B schematically and partially illustrate an example of an emissive display device with color LEDs according to an embodiment. In FIGS. 1A and 1B, a single pixel of the device has been shown. In practice, the device may comprise a plurality of identical or similar individually-controllable pixels. FIG. 1A is a top view of the device and FIG. 1B is a cross-section view along plane B-B of FIG. 1A.

Each pixel of the device of FIGS. 1A and 1B comprises three individually-controllable LEDs LG, LR, and LB, capable of respectively emitting in three different wavelength ranges. As an example, LED LG is capable of mainly emitting green light, LED LR is capable of mainly emitting red light, and LED LB is capable of mainly emitting blue light. Each pixel further comprises an elementary control cell CTRL integrated inside and on top of a semiconductor substrate 101, comprising three metal connection pads AG, AR, and AB respectively connected to the anode of LED LG, to the anode of LED LR, and to the anode of LED LB. In this example, each elementary control cell CTRL further comprises a metal connection pad K connected to the cathode of LED LG, to the cathode of LED LR, and to the cathode of LED LB. Cell CTRL enables to individually control LEDs LG, LR, and LB via connection pads AG, AR, and AB, it being understood that the different pixels of the display device may be individually controlled via their respective elementary control cells CTRL.

Each elementary control cell may comprise one or a plurality of transistors (not detailed in the drawings), for example, MOS transistors. In FIG. 1B, a stack 103 of dielectric conductive layers coating the upper surface of substrate 101 has been schematically shown. Stack 103 particularly comprises the metal connection pads K, AG, AR, and AB of each cell CTRL, and may further comprise metal interconnection elements (not detailed in the drawings) of the different components of elementary control cells CTRL. The upper surface of stack 103 forms the upper surface of control cells CTRL. In this example, the metal connection pads K, AG, AR, and AB of each control cell CTRL are flush with the upper surface of stack 103.

LED LG comprises a stack comprising, in the order from the upper surface of elementary control cell CTRL, a P-type doped semiconductor layer 105, defining the anode of LED LG, an active layer 107, and an N-type doped semiconductor layer 109, defining the cathode of LED LG. In top view, layers 105, 107, and 109 for example all have substantially the same surface area, defining the surface of LED LG. Each pixel further comprises, under LED LG, a metal layer 111 in contact, by its upper surface, with the lower surface of the anode layer 105 of the LED. Metal layer 111 for example extends under substantially the entire lower surface of LED LG. Each pixel further comprises a dielectric layer 113 forming an interface between elementary control cell CTRL and metal layer 111. Layer 113 is for example in contact, by its lower surface, with the upper surface of elementary control cell CTRL and, by its upper surface, with the lower surface of metal layer 111. Each pixel further comprises a metal via VG crossing layer 113 and connecting metal layer 111 to the connection pad AG of elementary control cell CTRL. Each pixel further comprises a dielectric protection layer 115 coating the upper surface of the cathode layer 109 of LED LG. Layer 115 is for example in contact with the upper surface of cathode layer 109, over substantially the entire upper surface of LED LG.

LED LR comprises a stack comprising, in the order from the upper surface of dielectric layer 115, a P-type doped semiconductor layer 117, defining the anode of LED LR, an active layer 119, and an N-type doped semiconductor layer 121, defining the cathode of LED LR. In top view, layers 117, 119, and 121 for example all have substantially the same surface area, defining the surface area of LED LR. In top view, the surface area of LED LR is smaller than the surface area of LED LG and is arranged opposite a central region of LED LG. Each pixel of the device further comprises, under LED LR, a metal layer 123 in contact, by its upper surface, with the lower surface of the anode layer 117 of LED LR. Metal layer 123 is for example in contact, by its lower surface, with the upper surface of dielectric layer 115. Metal layer 123 for example occupies substantially the same surface area as LED LR. In other words, the peripheral region of LED LG which is not coated with LED LR is not coated either with metal layer 123. Each pixel further comprises a metal via VR crossing layers 113, 111, 105, 107, 109, and 115 and connecting metal layer 123 to the connection pad AR of the elementary control cell CTRL of the pixel. Metal via VR is laterally insulated, particularly from layers 111, 105, 107, and 109, by a dielectric layer 125. Each pixel of the display device further comprises a dielectric protection layer 127 coating the upper surface of the cathode layer 121 of LED LR. Layer 127 is for example in contact with the upper surface of cathode layer 121, over substantially the entire upper surface of LED LR.

LED LB comprises a stack comprising, in the order from the upper surface of dielectric layer 127, a P-type doped semiconductor layer 129, defining the anode of LED LB, an active layer 131, and an N-type doped semiconductor layer 133, defining the cathode of LED LB. In top view, layers 129, 131, and 133 for example all have substantially the same surface area, defining the surface area of LED LB. In top view, the surface area of LED LB is smaller than the surface area of LED LR and is arranged opposite a central region of LED LR. Each pixel of the device further comprises, under LED LB, a metal layer 135 in contact, by its upper surface, with the upper surface of the anode layer 129 of the LED. Metal layer 135 is for example in contact, by its lower surface, with the upper surface of dielectric layer 127. Metal layer 135 for example substantially occupies the same surface area as LED LB. In other words, the peripheral region of LED LR which is not coated with LED LB is not coated either with metal layer 135. Each pixel further comprises a metal via VB crossing layers 113, 111, 105, 107, 109, 115, 123, 117, 119, 121, and 127 and connecting metal layer 135 to the connection pad AB of elementary control cell CTRL. Metal via VB is laterally insulated, particularly from layers 111, 105, 107, 109, 123, 117, 119, and 121, by a dielectric layer 137. Each pixel of the display device further comprises a dielectric protection layer 139 coating the upper surface of the cathode layer 133 of LED LB. Layer 139 is for example in contact with the upper surface of cathode layer 133, over substantially the entire surface area of LED LB.

Layers 105, 107, 109, 117, 119, 121, 129, 131, and 133 are for example layers based on III-V semiconductor materials, for example, based on gallium nitride, or based on AlInGaP (gallium-indium-aluminum phosphide). Each of active areas 107, 119, and 129 may be made of an alternation of layers of different materials, each defining multiple quantum wells. LEDs LG, LR, and LB may have respective anode layers and/or respective active layers, and/or respective cathode layers, of different compositions. In particular, the main emission wavelength of each LED particularly depends on the composition of its active layer.

Each pixel of the display device of FIGS. 1A and 1B further comprises a metallic peripheral wall 150 totally surrounding, in top view, the LEDs LG, LR, and LB of the pixel, and laterally separating the LEDs LG, LR, and LB of the pixel from the LEDs LG, LR, and LB of the other pixels of the device. In the shown example, metal wall 150 extends vertically from the upper surface of the elementary control cell CTRL of the pixel, that is, from the upper surface of interconnection stack 103, all the way to the upper surface of the dielectric protection layer 139 topping LED LB.

Peripheral wall 150 is laterally separated from the lower LED LG of the pixel by a thin dielectric layer 152 coating, in this example, the entire surface of the sides of layers 113, 111, 105, and 107. In top view, dielectric layer 152 has the shape of a closed ring. However, along at least a portion of the periphery of LED LG, the side of layer 109 is not coated with dielectric layer 152. At this location, peripheral wall 150 is in contact with the side of the cathode layer 109 of LED LG.

Peripheral wall 150 is further laterally separated from the intermediate LED LR of the pixel by a dielectric region 154 having a width substantially equal to the width of the peripheral region of LED LG which is not coated by LED LR. Region 154 coats the sides of layers 123, 117, 119, 121, and 127. In this example, a thin dielectric layer 156 laterally separates the sides of layers 123, 117, 119, 121, and 127 from region 154. Region 154 is interrupted along a portion of the periphery of LED LR. In other words, in top view, region 154 has the shape of an open ring. Layer 156 coats the entire surface of the sides of layers 123, 117, 119, 121, and 127. In other words, in top view, layer 156 has the shape of a closed ring. However, at the level of the area of interruption of dielectric region 154, the side of layers 121 and 127 is not coated with layer 156. At this location, metallic peripheral wall 150 exhibits a protrusion extending, in top view, towards the inside of the pixel and coming into contact with the side of the cathode layer 121 of LED LR and with the side of dielectric protection layer 127.

Peripheral wall 150 is further laterally separated from the upper LED LB of the pixel by a dielectric region 158 having a width substantially equal to the sum of the width of the peripheral region of LED LG which is not coated by LED LR and of the width of the peripheral region of LED LR which is not coated with LED LB. Region 158 coats the sides of layers 135, 129, 131, 133, and 139. In this example, a thin dielectric layer 160 laterally separates the sides of layers 135, 129, 131, 133, and 139 from region 158. Region 158 is interrupted along a portion of the periphery of LED LB. In other words, in top view, region 158 has the shape of an open ring. The area of interruption of region 158 is for example stacked on the area of interruption of region 154. Layer 160 coats the entire surface of the sides of layers 135, 129, 131, 133, and 139. In other words, in top view, layer 160 has the shape of a closed ring. However, at the level of the area of interruption of dielectric region 158, the side of layer 133 and the side of layer 139 are not coated with layer 160. At this location, metallic peripheral wall 150 exhibits a protrusion extending, in top view, towards the inside of the pixel and coming into contact with the side of the cathode layer 133 of LED LB and with the side of dielectric protection layer 139.

Thus, metal wall 150 is electrically connected to the cathode regions of LEDs LG, LR, and LB of the pixel. In this example, metal wall 150 is in contact, by its lower surface, with the cathode connection pad K of the elementary control cell CTRL of the pixel.

The pixel of FIGS. 1A and 1B operates as follows.

When lower LED LG is controlled, via connection pad AG, to emit light, the emitted light is vertically reflected on metal layer 123 and/or on metal layer 111, and laterally reflected on metal wall 150. Dielectric layer 115 and dielectric peripheral regions 154 and 158 are here considered as being substantially transparent for the light emitted by LED LG. Thus, the light G emitted by LED LG is extracted from the pixel by its upper surface, mainly along a vertical direction, in a ring-shaped peripheral region substantially corresponding to the peripheral region of LED LG which is not coated with LED LR.

When intermediate LED LR is controlled, via connection pad AR, the emitted light is vertically reflected on metal layer 135 and/or on metal layer 123, and laterally reflected on metal wall 150. Dielectric layer 127 and dielectric peripheral region 158 are here considered as being substantially transparent for the light emitted by LED LR. Thus, the light R emitted by LED LR is extracted from the pixel by its upper surface, mainly along a vertical direction, in a ring-shaped peripheral region substantially corresponding to the peripheral region of LED LR which is not coated with LED LB.

When upper LED LB controlled, via connection pad AB, to emit light, the light B emitted by LED LB is extracted from the pixel by its upper surface, mainly along a vertical direction, in a central peripheral region extending over substantially the entire surface of LED LB. Upper dielectric layer 139 is here considered as being substantially transparent for the light emitted by LED LB.

It should be noted that the order of the LED stack may be selected according to the expected performance per color. In particular, the surface area of the lower LED being larger than that of the intermediate LED, and the surface area of the intermediate LED being itself larger than the surface area of the upper LED, the LED having the smallest efficiency may be selected as the lower LED and that having the greatest efficiency may be selected as the upper LED.

Although this is not shown in FIGS. 1A and 1B, each of the cathode layers 109, 121, and 133 of LEDs LG, LR, and LB may comprise, on its upper surface side, nanostructures, for example forming photonic crystals, enabling to favor the extraction of light and the emission directivity of the LED, and thus to improve its efficiency. Preferably, nanostructures are formed only opposite the light extraction regions of each LED. In other words, in a preferred embodiment, layer 109 has nanostructures only on the peripheral portion of its upper surface which is not coated with LED LR or with metal wall 150, layer 121 has nanostructures only on the peripheral portion of its upper surface which is not coated with LED LB or with metal wall 150, and layer 133 has nanostructures over substantially its entire upper surface. The described embodiments are however not limited to this specific case.

Figure 2A:
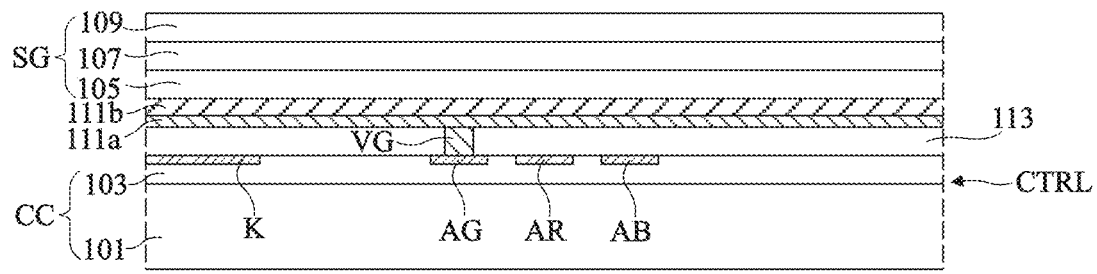
FIGS. 2A to 2R are cross-section or top views illustrating successive steps of an example of a method of manufacturing an emissive display device comprising LEDs according to an embodiment.
Figure 2B:
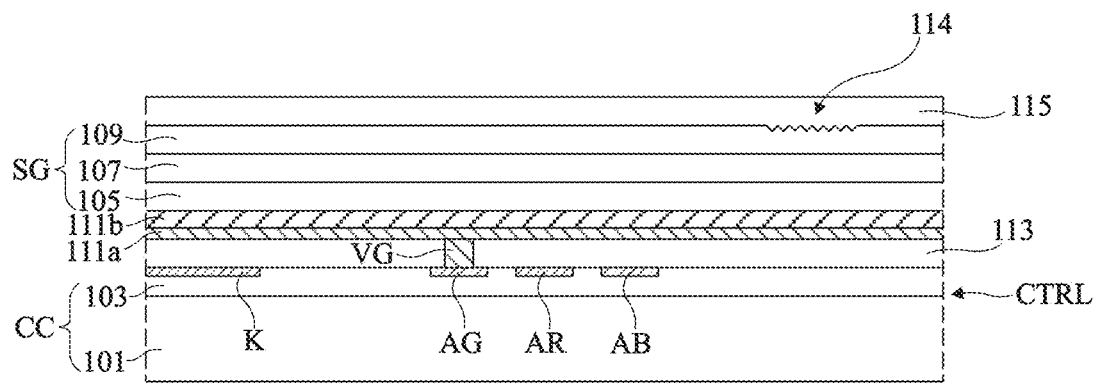
Figure 2C:
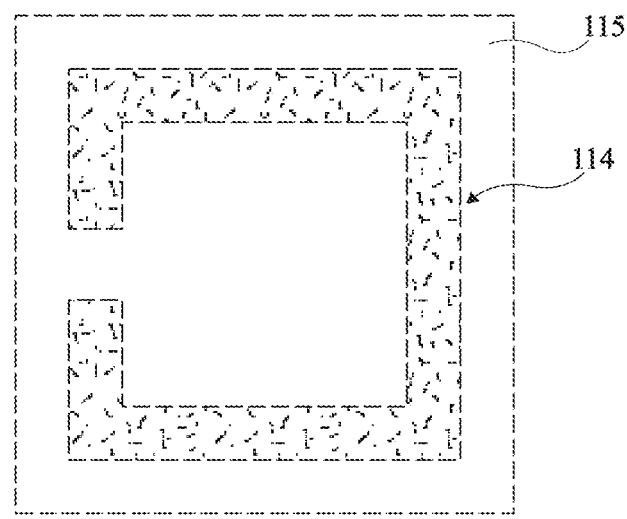
Figure 2D:
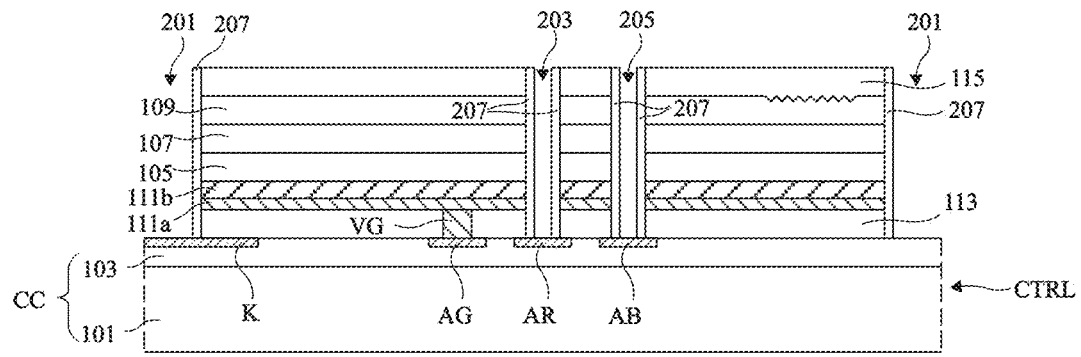
Figure 2E:
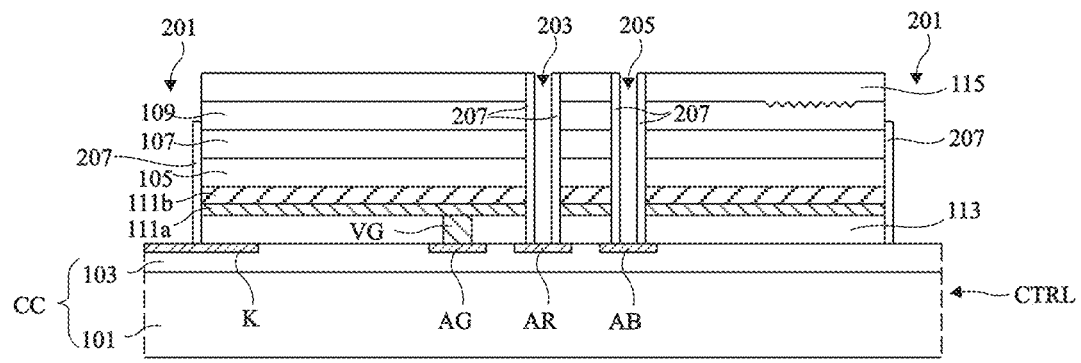
Figure 2F:
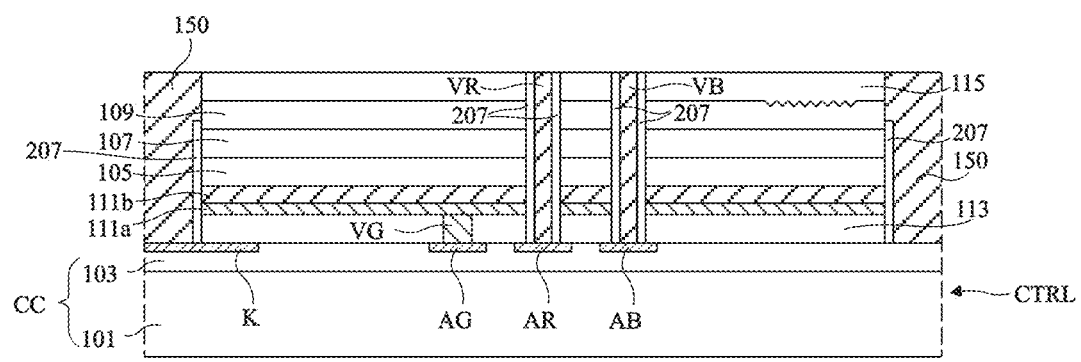
Figure 2G:
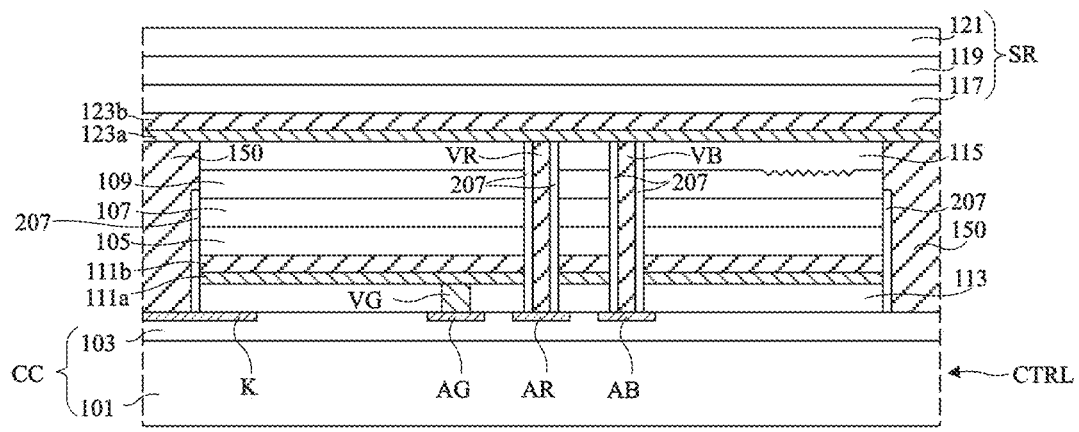
Figure 2H:
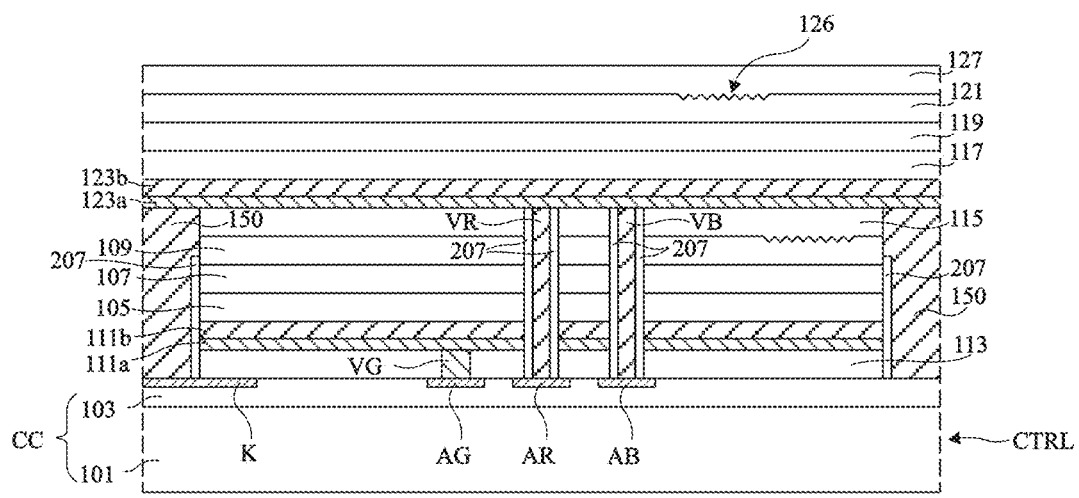
Figure 2I:
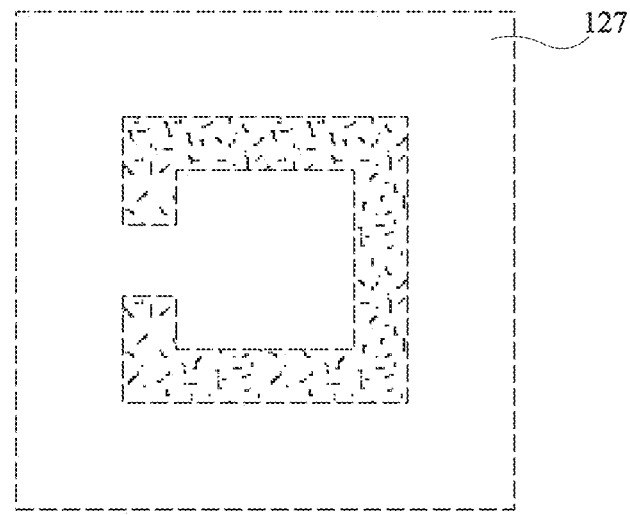
Figure 2J:
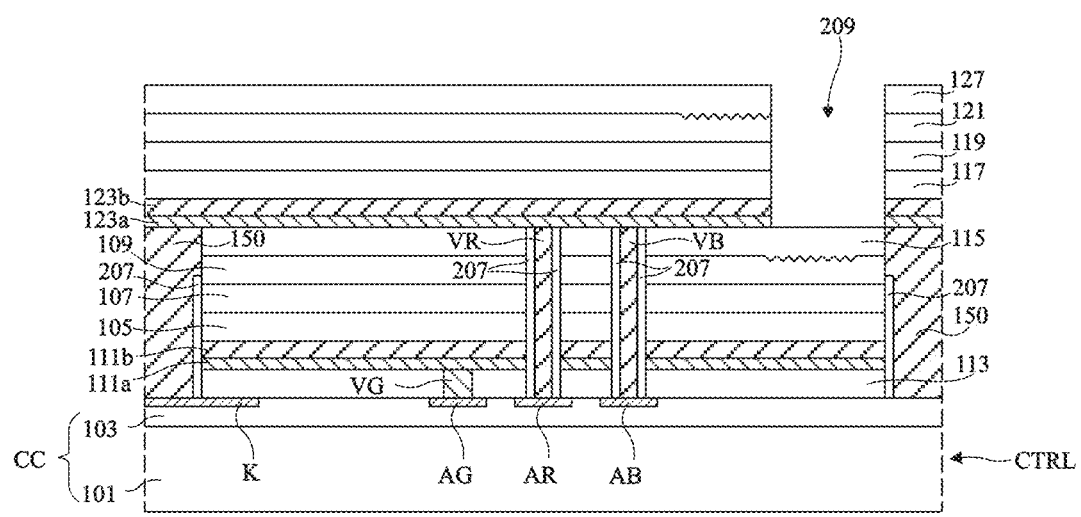
Figure 2K:
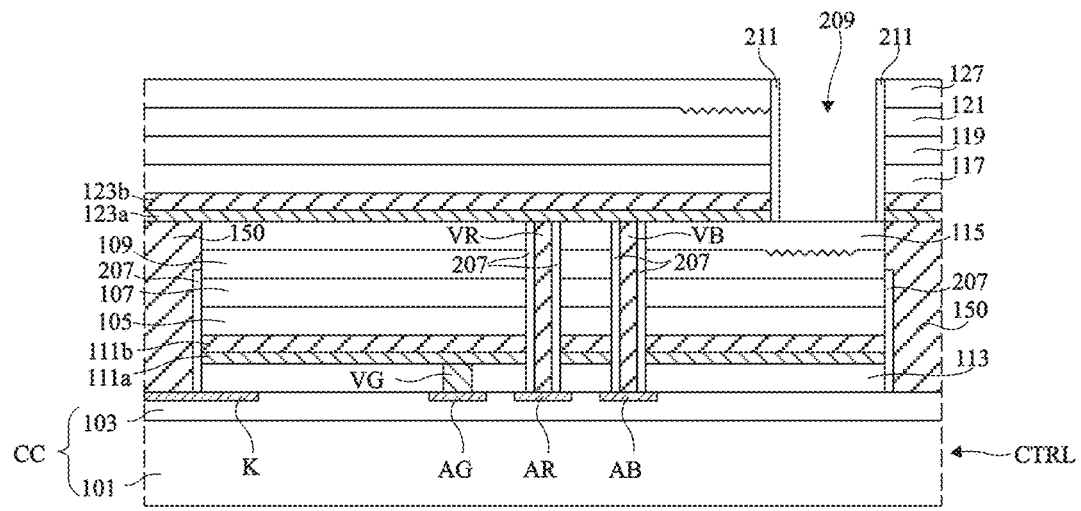
Figure 2L:
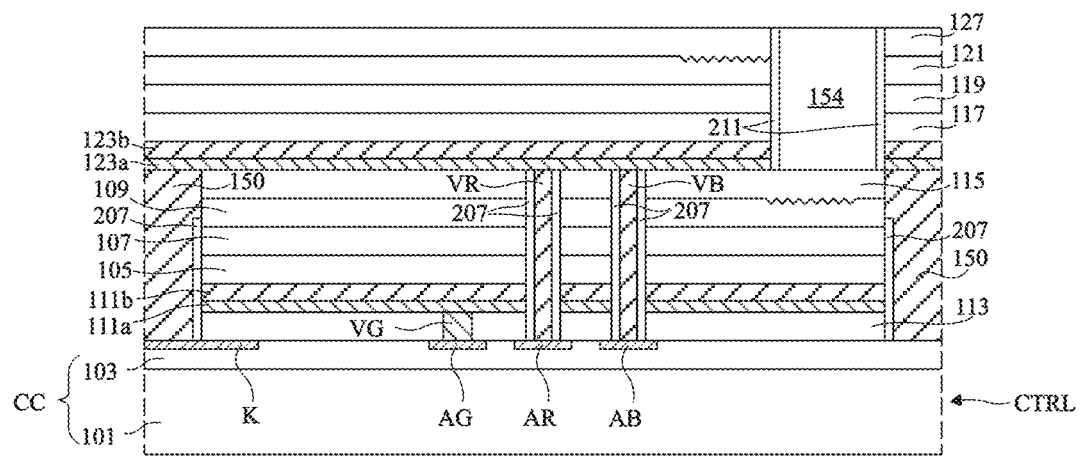
Figure 2M:
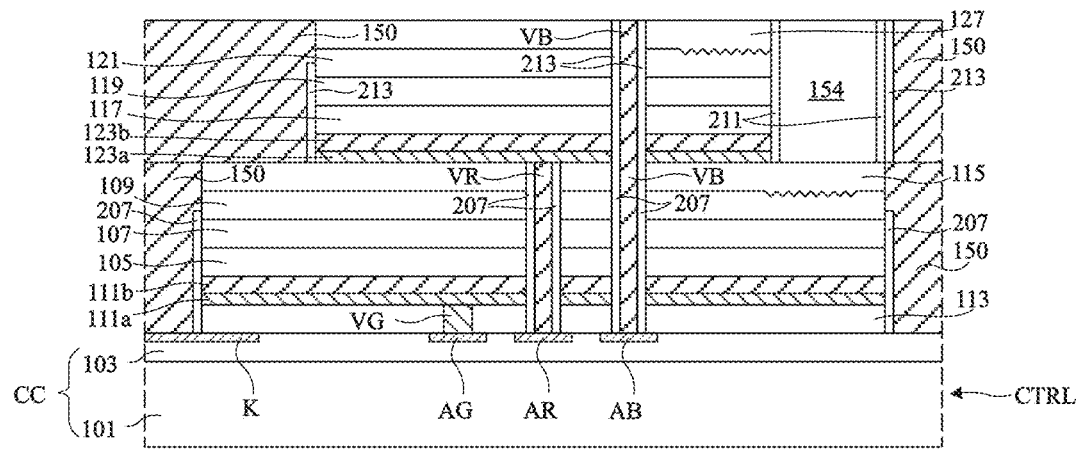
Figure 2N:
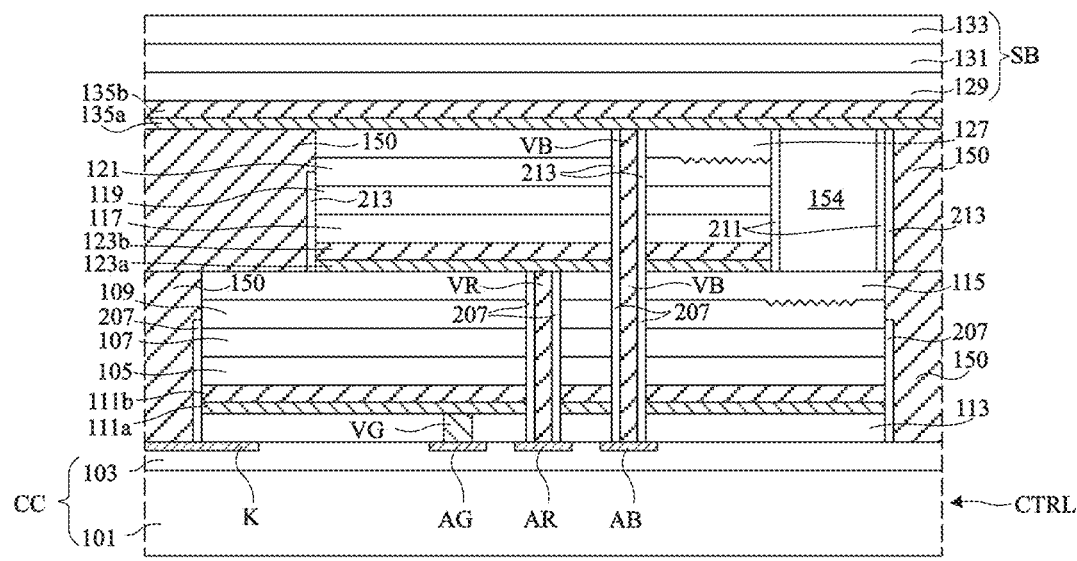
Figure 2O:
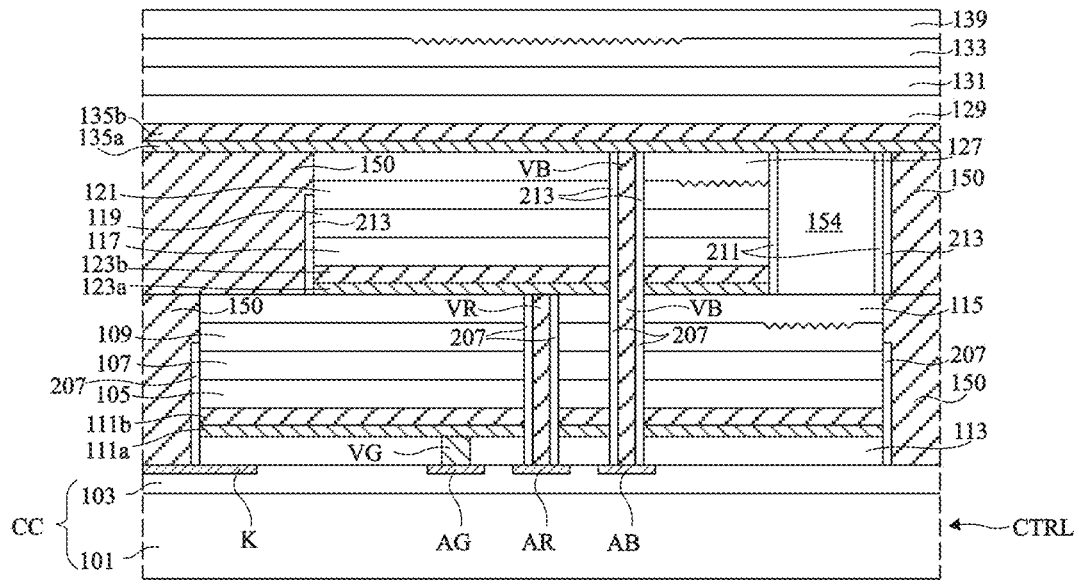
Figure 2P:
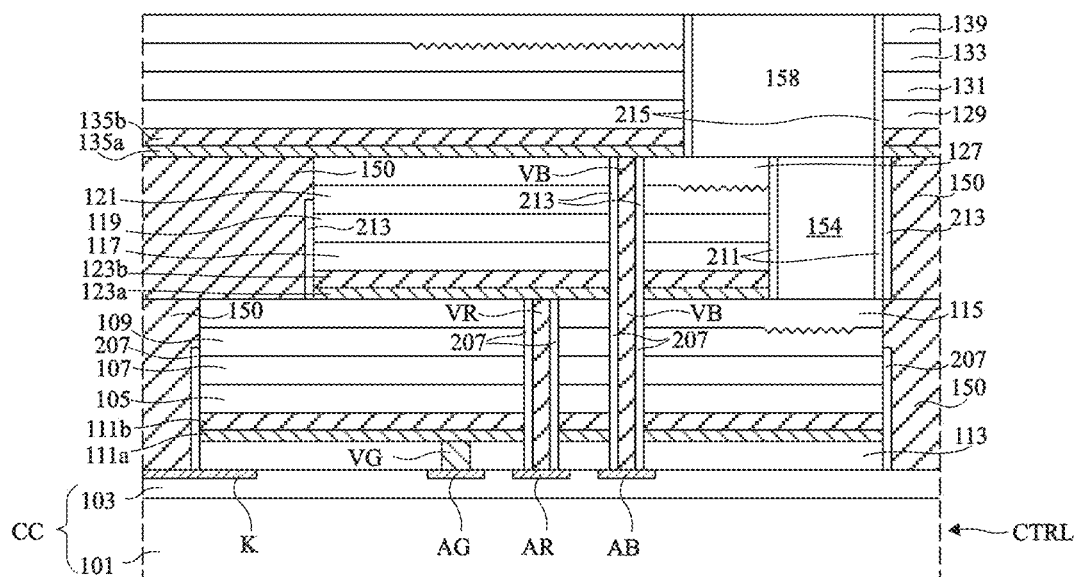
Figure 2Q:
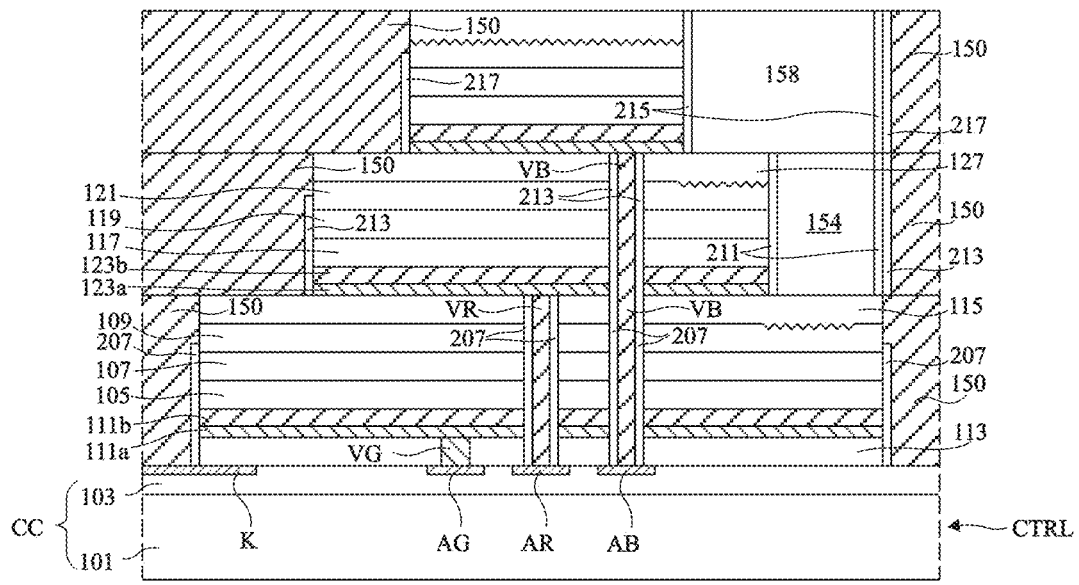
Figure 2R:
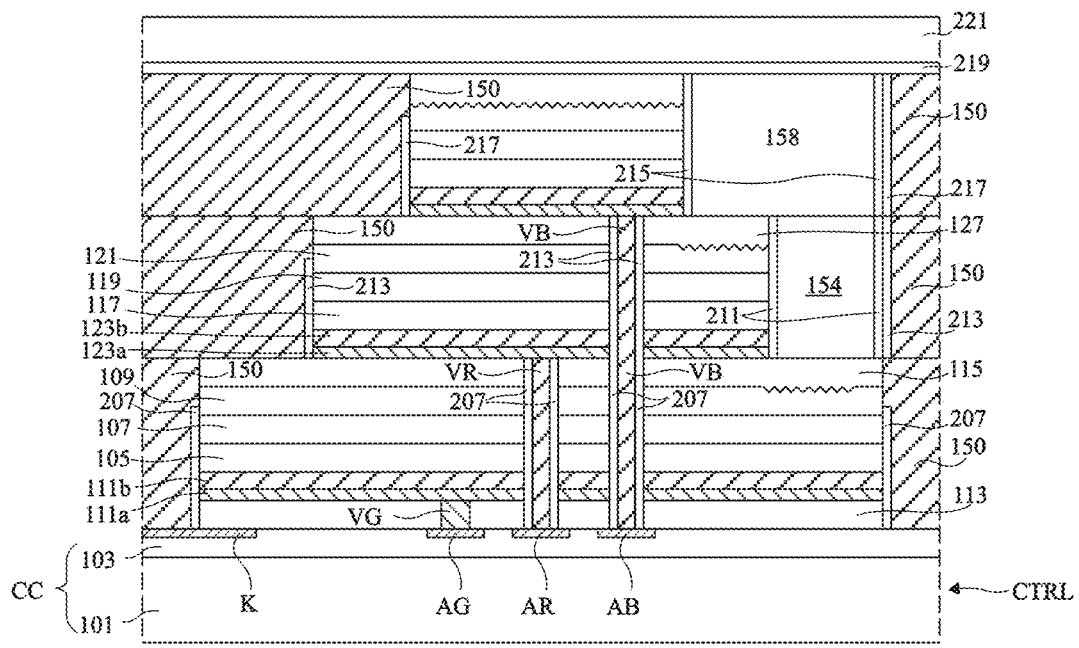

FIGS. 2A to 2R are cross-section or top views illustrating successive steps of an example of a method of manufacturing an emissive display device comprising LEDs of the type described in relation with FIGS. 1A and 1B.

In FIGS. 2A to 2R, the forming of a single pixel of the device has been shown, it being understood that, in practice, the display device may comprise a plurality of identical or similar pixels simultaneously and monolithically formed inside and on top of a same semiconductor substrate.

FIG. 2A is a cross-section view illustrating a step of transfer of a first active LED stack SG onto the upper surface of an integrated control circuit CC previously formed inside and on top of a semiconductor substrate 101, for example, made of silicon. Control circuit CC comprises, for each pixel of the display device, an elementary cell CTRL for controlling the LEDs LG, LR, and LB of the pixel. In top view (not shown), the elementary control cells CTRL are for example arranged in an array of rows and columns. Control circuit CC is for example formed in CMOS technology ("Complementary Metal Oxide Semiconductor").

Stack SG is formed by layers 105, 107, and 109 which, at this stage, each extend continuously over the entire upper surface of the control circuit. Stack SG is for example formed by epitaxy on a surface of a growth substrate, not shown, for example, a sapphire substrate. More particularly, layer 109, and then layer 107, and then layer 105 may be successively deposited on the growth substrate. One or a plurality of buffer layers, not shown, may form an interface between the growth substrate and layer 109. Layer 107 is for example deposited on top of and in contact with the surface of layer 109 opposite to the growth substrate. Layer 105 may be deposited on top of and in contact with the surface of layer 107 opposite to the growth substrate.

Prior to the transfer of stack SG onto control circuit CC, dielectric layer 113 and metal vias VG may be formed on the upper surface of control circuit CC. A metal layer 111a may then be deposited on top of and in contact with the upper surface of dielectric layer 113 and of metal vias VG. Layer 111a for example continuously extends over the entire upper surface of control circuit CC. Further, a metal layer 111b may be deposited on top of and in contact with the surface of layer 105 opposite to the growth substrate of stack SG. Layer 111b for example continuously extends over the entire surface of stack SG opposite to the growth substrate.

The assembly comprising the growth substrate, stack SG, and metal layer 111b may then be transferred onto the assembly comprising control circuit CC, dielectric layer 113, metal vias VG, and metal layer 111a, by direct bonding (or by thermocompression) of the surface of metal layer 111b opposite to the growth substrate onto the surface of metal layer 111a opposite to semiconductor substrate 101.

The growth substrate of stack SG may then be removed, for example, by a LLO-type ("Laser Lift Off") method. The possible buffer layer(s) present on the upper surface of layer 109 may further be removed, for example, by CMP ("Chemical Mechanical Polishing") or also by RIE ("Reactive Ion Etching") or by IBE ("Ion Beam Etching"), to free the access to the upper surface of layer 109.

In this example, metal layers 111a and 111b correspond, once assembled, to the layer 111 of the structure of FIGS. 1A and 1B.

FIGS. 2B and 2C are respectively a cross-section view and a top view illustrating a step of forming, on the upper surface of layer 109, of nanostructures 114, for example forming photonic crystals, aiming at favoring the extraction of the photons generated by LEDs LG. As an example, the nanostructures are only formed in the peripheral portion of each LED LG intended to be coated with the dielectric region 154 of the corresponding pixel. As a variant, the nanostructures may be formed over the entire upper surface of layer 109, except for the regions intended to be etched during subsequent steps of the method.

FIGS. 2B and 2C further illustrate a subsequent step of deposition of a dielectric protection layer 115, for example, a silicon oxide or silicon nitride layer, on top of and in contact with the upper surface of layer 109. Layer 115 for example continuously extends over the entire upper surface of layer 109. Layer 115 is particularly used as a nanostructure encapsulation layer, and may further be used as a hard mask for the etching of stack SG.

FIG. 2D illustrates a step of lithography and etching of active LED stack SG. During this step, trenches 201 are formed from the upper surface of the structure. Trenches 201 laterally delimit the LEDs LG of the different pixels of the device. In the shown example, trenches 201 extend vertically from the upper surface of dielectric layer 115 to the upper surface of control circuit CC. At the end of this step, each LED LG has the shape of a ring or mesa totally separated from the neighboring LEDs LG by trenches 201. In top view, trenches 201 for example form a continuous grid delimiting the pixels of the device. Trenches 201 are intended to receive the metallic peripheral walls 150 of the pixels.

FIG. 2D further illustrates the forming, in each pixel of the device, of a through opening 203 vertically extending from the upper surface of dielectric layer 115 to the upper surface of control circuit CC, opposite the anode connection pad AR of the elementary control cell CTRL of the pixel, and of a through opening 205 vertically extending from the upper surface of dielectric layer 115 to the upper surface of control circuit CC, opposite the anode connection pad AB of the elementary control cell CTRL of the pixel. Openings 203 and 205 are intended to respectively receive the metal vias VR and VB of the pixel. Openings 203 and 205 are for example formed at the same time a trenches 201.

FIG. 2D further illustrates a step of deposition of a thin dielectric layer 207 on the lateral walls of trenches 201 and of openings 203 and 205. The thickness of layer 207 is for example smaller than 200 nm, for example, in the order of 50 nm. Layer 207 may be an oxide layer, for example, an alumina layer ($Al_2O_3$). Layer 207 may be deposited by a conformal deposition method, for example, by ALD ("Atomic Layer Deposition"). As an example, layer 207 is first continuously deposited over the entire surface of the structure, and then removed from the bottom of trenches 201 and of openings 203 and 207 and from the upper surface of dielectric layer 115 by a vertical anisotropic etching method. The layer 207 of FIG. 2D corresponds to the dielectric regions 152 and 125 of FIG. 1B, as well as to a lower portion of the dielectric layer 137 of FIG. 1B.

FIG. 2E is a cross-section view illustrating a step of removal of an upper portion of dielectric layer 207 from the lateral walls of trenches 201. More particularly, layer 207 is removed, from trenches 201, on the sides of dielectric layer 115 and on an upper portion of the sides of the cathode layers 109 of LEDs LG, to allow the forming of an electric contacting area on layer 109, via metal walls 150. Layer 207 is however kept on the sides of active layer 107 and of the underlying layers, to electrically insulate layers 105, 107, and 111 from metal walls 150. Layer 207 is further kept all along the height of openings 203 and 205, to electrically insulate metal vias VR and VB from LED LG.

To perform such a partial removal of layer 207, a protection resin layer may first be deposited over the entire upper surface of the structure, the resin layer extending over the upper surface of dielectric layer 115 and filling trenches 201 and openings 203 and 205. The resin may then be partially removed from trenches 201, to expose the portion of layer 207 which is desired to be removed. The exposed portions of layer 207 may then be removed by etching. It should be noted that the upper portion of dielectric layer 207 may be removed, in top view, from the entire periphery of each LED LG as shown in FIG. 1B or, as a variant, from a portion only of the periphery of each LED LG (for example, only opposite the area of interruption of the dielectric region 154 of the pixel).

FIG. 2F is a cross-section view illustrating a step of filling of trenches 201 and of openings 203 and 205 with metal, to form a lower portion of metal walls 150, as well as metal vias VR and a lower portion of metal vias VB. The filling is for example performed by a damascene-type method. At the end of this step, the metal deposited in trenches 201 and in openings 203 and 205 is flush with the upper surface of dielectric layer 115. In each pixel, the lower portion of metallic peripheral wall 150 is in contact with at least a portion of the sides of the cathode layer 109 of LED LG, at the level of the dielectric layer portion removed at the step of FIG. 2E. As an example, the metal deposited at this step comprises copper, aluminum, or tungsten, or a stack of a plurality of these materials.

FIG. 2G is a cross-section view illustrating a step of transfer of a second active LED stack SR onto the upper surface of the structure obtained at the end of the steps of FIGS. 2A to 2F.

Stack SR is formed by layers 117, 119, and 121 which, at this stage, each continuously extend over the entire upper surface of the device. Stack SR is for example formed by epitaxy on a surface of a growth substrate, not shown. More particularly, layer 121, and then layer 119, and then layer 117, may be successively deposited on the growth substrate. One or a plurality of buffer layers, not shown, may form an interface between the growth substrate and layer 121. Layer 119 is for example deposited on top of and in contact with the surface of layer 121 opposite to the growth substrate. Layer 117 may be deposited on top of and in contact with the surface of layer 119 opposite to the growth substrate.

Prior to the transfer, a metal layer 123a may be deposited on top of and in contact with the upper surface of the structure obtained at the end of the steps of FIGS. 2A to 2F. Layer 123a for example continuously extends over the entire upper surface of the structure, and in particular over the upper surface of dielectric layer 115 and over the upper surface of the lower portions of metal walls 150 and of metal vias VB as well as on the upper surface of metal vias VR. Further, a metal layer 123b may be deposited on top of and in contact with the surface of layer 117 opposite to the growth substrate of stack SR. Layer 123b for example continuously extends over the entire surface of stack SR opposite to the growth substrate.

The assembly comprising the growth substrate, stack SR, and metal layer 123b may then be transferred onto the upper surface of the structure obtained at the end of the steps of FIGS. 2A to 2G, by direct bonding of the surface of metal layer 123b opposite to the growth substrate onto the surface of metal layer 123a opposite to semiconductor substrate 101.

The growth substrate of stack SR may then be removed, for example, by a chemical removal method. The possible buffer layer(s) present on the upper surface of layer 121 may further be removed to free the access to the upper surface of layer 121.

In this example, metal layers 123a and 123b correspond, once assembled, to the layer 123 of the structure of FIGS. 1A and 1B.

FIGS. 2H and 2I are respectively a cross-section and a top view illustrating a step of forming, on the upper surface of layer 121, of nanostructures 126, for example forming photonic crystals, aiming at favoring the extraction of the photons generated by LEDs LR. As an example, the nanostructures are only formed in the peripheral portion of each LED LR intended to be coated with the dielectric region 158 of the corresponding pixel. As a variant, the nanostructures may be formed over the entire upper surface of layer 121, except for the regions intended to be etched during subsequent steps of the method.

FIGS. 2H and 2I further illustrate a subsequent step of deposition of a dielectric protection layer 127, for example, a silicon nitride layer, on top of and in contact with the upper surface of layer 121. Layer 127 for example continuously extends over the entire upper surface of layer 121. Layer 127 is particularly used as a nanostructure encapsulation structure, and may further be used as a hard mask layer for the etching of stack SR.

FIG. 2J is a cross-section view illustrating a first step of lithography and etching of active LED stack SR. During this step, in each pixel, an opening 209 is formed from the upper surface of the structure. Opening 209 extends vertically from the upper surface of dielectric layer 127 to the upper surface of dielectric layer 115. Opening 209 laterally delimits a portion of the periphery of LED LR of the pixel. Opening 209 is intended to receive the dielectric region 154 of the pixel. In top view, opening 209 has substantially the same open-ring shape as the future dielectric region 154 of the pixel. In other words, at this step, stack SR is not etched opposite area 155 (FIG. 1B) of interruption of the dielectric peripheral region 154 of the pixel.

FIG. 2K is a cross-section view illustrating a step of deposition of a thin dielectric layer 211, for example, an oxide or nitride layer, on the lateral walls of openings 209. The thickness of layer 211 is for example smaller than 200 nm, for example, in the order of 50 nm. Layer 211 may be deposited by a conformal deposition method, for example, by ALD. As an example, layer 211 is first continuously deposited over the entire surface of the structure, and then removed from the bottom of openings 209 and on the upper surface of dielectric layer 127 by a vertical anisotropic etching method. The portion of layer 211 of FIG. 2K coating the sides of LED LG corresponds to the portion of dielectric layer 156 of FIG. 1B located, in top view, outside of the area of interruption of the dielectric region 154 of the pixel.

FIG. 2L is a cross-section view illustrating a step of filling of openings 209 with a dielectric material, for example, oxide and/or nitride, to form the dielectric region 154 of each pixel. As an example, a dielectric thickness greater than the height of openings 209 may first be deposited, after which a step of planarization of the upper surface of the structure may be implemented, for example, by CMP, so that dielectric regions 154 are flush with the upper surface of dielectric layer 127.

FIG. 2M illustrates the structure obtained at the end of steps similar to the steps described in relation with FIGS. 2D to 2F, but applied to stack SR.

In particular, a step of lithography and etching of active LED stack SR is implemented to form trenches intended to receive an intermediate portion of metallic peripheral walls 150. The trenches formed at this step extend vertically from the upper surface of dielectric layer 127 to the upper surface of the lower portion of metallic peripheral wall 150. In top view, the trenches extend substantially along the same pattern as the trenches 201 formed at the step of FIG. 2D. In each pixel, a trench portion extending, in top view, from the periphery to the inside of the pixel, is further formed opposite the area of interruption of the dielectric region 154 of the pixel. This trench portion is intended to receive the protrusion of metal wall 150 in contact with the side of LED LR. During the lithography and etch step, an opening emerging onto the upper surface of the lower portion of metal via VB formed at the step of FIG. 2F is further formed in each pixel, opposite the anode connection pad AB of the pixel, this opening being intended to receive an upper portion of metal via VB.

A thin dielectric layer 213 is then deposited on the lateral walls of the trenches and openings formed at the previous step. The thickness of layer 213 is for example smaller than 200 nm, for example, in the order of 50 nm. Layer 213 may be an oxide or nitride layer deposited by a conformal deposition method, for example, by PECVD ("Plasma Enhanced Chemical Vapor Deposition"). As an example, layer 213 is first continuously deposited over the entire surface of the structure, and then removed from the bottom of the trenches and of the openings and from the upper surface of dielectric layer 127, by a vertical anisotropic etching method. At the level of the area of interruption of dielectric region 154, layer 213 comes into contact with the sides of LED LR. At this location, layer 213 corresponds to the dielectric layer 156 of FIG. 1B. In the opening intended to receive the upper portion of via VB, layer 213 corresponds to an upper portion of the dielectric layer 137 of FIG. 1B.

A step similar to the step of FIG. 2E is then implemented, during which an upper portion of dielectric layer 213 is removed from the sides of dielectric layer 127 and from an upper portion of the sides of cathode layer 121 of each LED LR, in the area of interruption of dielectric region 154, to allow the forming of an electric contacting area on layer 121, via metal walls 150. Layer 213 is however kept on the sides of active layer 119 and of the underlying layers, to electrically insulate layers 123, 117, and 119 from metal walls 150. Layer 213 is further kept all along the height of the opening intended to receive the upper portion of metal via VB, to electrically insulate via VB from LED LR.

FIG. 2M further illustrates a step similar to the step of FIG. 2F, of filling of the trenches and openings with metal, to form an intermediate portion of metal walls 150, as well as in the upper portion of metal vias VB. At the end of this step, the metal deposited in the trenches and openings is flush with the upper surface of dielectric layer 127 and of dielectric region 154. In each pixel, the intermediate portion of metal wall 150 is in contact with a portion of the sides of the cathode layer 121 of LED LR, at the level of the area of interruption of dielectric region 154 of the pixel. As an example, the metal deposited at this step comprises titanium, aluminum or copper, germanium, nickel, platinum, or a stack of one or a plurality of these materials.

FIG. 2N is a cross-section view illustrating a step of transfer of a third active LED stack SB onto the upper surface of the structure obtained at the end of the steps of FIGS. 2A to 2M. Stack SB is formed by layers 129, 131, and 133 which, at this stage, each extend continuously over the entire upper surface of the device. Stack SB is for example formed by epitaxy on a surface of a growth substrate for example, a sapphire substrate, not shown. More particularly, layer 133, and then layer 131, and then layer 129 may be successively deposited on the growth substrate. One or a plurality of buffer layers, not shown, may form an interface between the growth substrate and layer 133. Layer 131 is for example deposited on top of and in contact with the surface of layer 133 opposite to the growth substrate. Layer 129 may be deposited on top of and in contact with the surface of layer 131 opposite to the growth substrate.

Prior to the transfer, a metal layer 135a may be deposited on top of and in contact with the upper surface of the structure obtained at the end of the steps of FIGS. 2A to 2M. Layer 135a for example extends continuously over the entire upper surface of the structure. Further, a metal layer 135b may be deposited on top of and in contact with the surface of layer 129 opposite to the growth substrate of stack SB. Layer 135b for example continuously extends all over the surface of stack SB opposite to the growth substrate.

The assembly comprising the growth substrate, stack SB, and metal layer 135b may then be transferred onto the upper surface of the structure obtained at the end of the steps of FIGS. 2A to 2M, by direct bonding or thermocompression of the surface of metal layer 135b opposite to the growth substrate onto the surface of metal layer 135a opposite to semiconductor substrate 101.

The growth substrate of stack SB may then be removed, for example, by an LLO-type method. The possible buffer layer(s) present on the upper surface of layer 133 may further be removed to free the access to the upper surface of layer 133.

In this example, metal layers 135a and 135b correspond, once assembled, to the layer 135 of the structure of FIGS. 1A and 1B.

FIG. 2O is a cross-section view illustrating a step of forming, on the upper surface of layer 133, of nanostructures, for example, photonic crystals, aiming at favoring the extraction of the photons generated by LEDs LB. As an example, the nanostructures are formed, in each pixel, all over the surface of LED LB of the pixel. Preferably, the nanostructures are not formed on the regions of layer 133 intended to be etched during subsequent steps of the method.

FIG. 2O further illustrates a subsequent step of deposition of a dielectric protection layer 139, for example a silicon oxide or silicon nitride layer, on top of and in contact with the upper surface of layer 133. Layer 139 extends for example continuously all over the upper surface of layer 133. Layer 139 is particularly used as a nanostructure encapsulation layer, and may further be used as a hard mask for the etching of stack SB.

FIG. 2P is a cross-section view illustrating the structure obtained at the end of steps similar to the steps of FIGS. 2J to 2L, but applied to stack SB.

More particularly, after the steps of FIG. 2O, a first step of lithography and etching of active LED stack SB is implemented. During this step, in each pixel an opening is formed from the upper surface of the structure, this opening vertically extending from the upper surface of dielectric layer 139 to the upper surface of dielectric layer 127, and laterally delimiting a portion of the periphery of LED LB of the pixel. The opening formed at this step is intended to receive the dielectric region 158 of the pixel. In top view, this opening substantially has the same open-ring shape as the future dielectric region 158 of the pixel. In other words, at this step, stack SB is not etched opposite the area of interruption of the dielectric peripheral region 158 of the pixel.

A thin dielectric layer 215, for example, an oxide or nitride layer, is then deposited on the lateral walls of the opening. The thickness of layer 215 is for example smaller than 200 nm, for example, in the order of 50 nm. Layer 215 may be deposited by a conformal deposition method, for example, by ALD. As an example, layer 215 is first continuously deposited over the entire surface of the structure, and then removed from the bottom of the openings and from the upper surface of dielectric layer 139 by a vertical anisotropic etching method. The portion of layer 215 coating the sides of LED LB corresponds to the portion of the dielectric layer 160 of FIG. 1B located, in top view, outside of the area of interruption of the dielectric region 158 of the pixel.

The openings are then filled with a dielectric material, for example, oxide and/or nitride, to form the dielectric region 158 of each pixel. As an example, a dielectric thickness greater than the height of the openings may first be deposited, and then a step of planarization of the upper surface of the structure may be implemented, for example, by CMP, so that dielectric regions 158 are flush with the upper surface of dielectric layer 139.

FIG. 2Q is a cross-section view illustrating the structure obtained at the end of steps similar to the steps described in relation with FIG. 2M, but applied to stack SB.

In particular, a step of lithography and etching of active LED stack SB is implemented to form trenches intended to receive an upper portion of metallic peripheral walls 150. The trenches formed at this step extend vertically from the upper surface of dielectric layer 139 to the upper surface of the intermediate portion of metallic peripheral wall 150. In top view, the trenches extend substantially along the same pattern as the trenches 201 formed at the step of FIG. 2D. In each pixel, a trench portion extending, in top view, from the periphery to the inside of the pixel, is further formed opposite the area of interruption of the dielectric region 158 of the pixel. This trench portion is intended to receive the protrusion of metal wall 150 in contact with the side of LED LB.

A thin dielectric layer 217 is then deposited on the lateral walls of the trenches. The thickness of layer 217 is for example smaller than 200 nm, for example, in the order of 50 nm. Layer 217 may be an oxide or nitride layer deposited by a conformal deposition method, for example, by ALD. As an example, layer 217 is first continuously deposited over the entire surface of the structure, and then removed from the bottom of the trenches and of the openings and from the upper surface of dielectric layer 139, by a vertical anisotropic etching method. At the level of the area of interruption of dielectric region 158, layer 217 comes into contact with the sides of LED LB. At this location, layer 217 corresponds to the dielectric layer 160 of FIG. 1B.

A step similar to the step of FIG. 2E is then implemented, during which an upper portion of dielectric layer 217 is removed from the sides of dielectric layer 139 and from an upper portion of the sides of the cathode layer 133 of each LED LB, in the area of interruption of dielectric region 158, to allow the forming of a contacting area on layer 133, via metal walls 150. Layer 217 is however kept under the sides of active layer 131 and underlying layers, to electrically insulate layers 135, 129, and 131 from metal walls 150.

FIG. 2Q further illustrates a step similar to the step of FIG. 2F, of filling of the trenches and openings with metal, to form an intermediate portion of metal walls 150. At the end of this step, the metal deposited in the trenches and openings is flush with the upper surface of dielectric layer 139 and of dielectric region 158. The metal deposited in the trenches is in contact with a portion of the sides of the cathode layer 133 of each LED LB, at the level of the area of interruption of dielectric region 158. The metal deposited at this step for example comprises copper, aluminum, and tungsten, or a stack of a plurality of these materials.

FIG. 2R is a cross-section view illustrating a step of deposition of one or a plurality of dielectric passivation layers on the upper surface of the structure obtained at the end of the steps of FIGS. 2A to 2Q. In the shown example, two dielectric layers 219 and 221 are successively deposited on the upper surface of the structure. Layers 219 and 221 are for example respectively a silicon nitride layer and a silicon oxide layer. The thickness of layer 219 is for example in the order of 40 nm. The thickness of layer 221 is for example in the order of 600 nm. As an example, each of layers 219 and 221 extends continuously over the entire upper surface of the device. Layer 219 may be deposited on top of and in contact with the upper surface of the structure of FIG. 2Q, that is, on top of and in contact with the upper surface of metal walls 150, of dielectric region 158, and of dielectric layer 139. Layer 221 is for example deposited on top of and in contact with the upper surface of layer 219.

Various embodiments and variants have been described. Those skilled in the art will understand that certain features of these various embodiments and variants will occur to those skilled in the art. In particular, although embodiments of pixels each comprising three LEDs capable of respectively emitting in three different wavelength ranges, it will be within the abilities of those skilled in the art to adapt the described embodiments to the forming of pixels, each comprising a number of LEDs of different colors different from three, for example, equal to two or greater than three.

Further, all the conductivity types of the described semiconductor regions may be inverted. In this case, the anode regions of the described structures become cathode regions, and conversely.

Further, in the above-described examples, each LED comprises nanostructures, for example photonic crystals on the upper surface of its cathode layer. As a variant, the nanostructures may be omitted at least over part of or all the LEDs.

Further, although LEDs of square or rectangular general shape (in top view) have been shown, the described embodiments are not limited to this specific case. As a variant, the LEDs may have, in top view, other shapes than those shown, for example, circular, elliptic, and other shapes.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An emissive display device comprising LEDs, comprising a plurality of pixels, each comprising:
   an elementary control cell formed inside and on top of a semiconductor substrate;
   a first LED capable of emitting in a first wavelength range, arranged on the upper surface of the elementary control cell and having a first conduction region connected to a first connection pad of the elementary control cell; and a second LED capable of emitting in a second wavelength range, having a surface area smaller than that of the first LED, arranged on the upper surface of the first LED opposite a central region of the first LED, and having a first conduction region connected to a second connection pad of the elementary control cell via a first conductive via (VR) crossing the first LED, wherein each pixel comprises a metallic peripheral wall totally surrounding the pixel and extending all along the height of the LEDs of the pixel, and wherein, in each pixel, each LED has a second conduction region connected to the metallic peripheral wall of the pixel.

2. The device according to claim 1, wherein each pixel further comprises a third LED capable of emitting in a third wavelength range, having a surface area smaller than that of the second LED, arranged on the upper surface of the second LED opposite a central region of the second LED, and having a first conduction region connected to a third connection pad of the elementary control cell via a second conductive via crossing the first and second LEDs.

3. The device according to claim 1, wherein the peripheral wall is reflective for the light emitted by each LED and forms a mirror guiding the light emitted by each LED.

4. The device according to claim 1, wherein each LED comprises a stack comprising, in the order from the upper surface of the semiconductor substrate, a first doped semiconductor layer of a first conductivity type, forming the first conduction region of the LED, an active layer, and a second doped semiconductor layer of the second conductivity type, forming the second conduction region of the LED.

5. The device according to claim 4, wherein, in each pixel, each LED is connected to the metallic peripheral wall of the pixel by a side of its second semiconductor layer.

6. The device according to claim 4, wherein, in each pixel, each LED has its first semiconductor layer in contact, by its lower surface, with a metal layer extending under the entire surface of the LED.

7. The device according to claim 6, wherein for each LED, the metal layer in contact with the lower surface of the first semiconductor layer of the LED is a reflective layer forming a mirror guiding the light emitted by each LED.

8. The device according to claim 1, wherein the first and second conduction regions of the LEDs are respectively anode regions and cathode regions.

9. The device according to claim 1, wherein each pixel comprises a transparent dielectric region covering a peripheral portion of the first LED which is not covered by the second LED.

10. The device according to claim 1, wherein the first LED has, in a peripheral portion of the first LED which is not covered by the second LED, nanostructures capable of favoring the extraction of the light emitted by the first LED.

11. A method of manufacturing the emissive display device comprising LEDs according to claim 1, comprising the successive steps of:
placing a first active LED stack on the upper surface of an integrated control circuit comprising the elementary control cells of the device, so that the first active LED stack continuously extends all over the surface of the integrated control circuit;
forming in the first active LED stack trenches laterally delimiting the first LEDs of the device;
placing a second active LED stack on the upper surface of the assembly comprising the integrated control circuit and the first LEDs, so that the first active LED stack continuously extends all over the surface of the integrated control circuit; and
forming in the second active LED stack trenches laterally delimiting the second LEDs of the device.

* * * * *